(12) United States Patent
Chen et al.

(10) Patent No.: US 6,218,200 B1
(45) Date of Patent: Apr. 17, 2001

(54) MULTI-LAYER REGISTRATION CONTROL FOR PHOTOLITHOGRAPHY PROCESSES

(75) Inventors: Gong Chen, Gilbert; Robert D. Colclasure, Jr., Apache Junction; Wayne M. Paulson, Chandler, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/616,152

(22) Filed: Jul. 14, 2000

(51) Int. Cl.⁷ .............................. H01L 21/66; G01R 31/26
(52) U.S. Cl. ................... 438/14; 430/30; 430/5; 430/22; 356/401; 356/399; 73/105
(58) Field of Search ................... 438/14, 22, 30; 356/399

(56) References Cited

U.S. PATENT DOCUMENTS

| | | | |
|---|---|---|---|
| 5,498,500 | * | 3/1996 | Bae ........................................ 430/22 |
| 5,756,238 | * | 5/1998 | Barr et al. ................................ 430/5 |
| 5,952,132 | * | 9/1999 | King et al. .............................. 430/22 |
| 6,023,338 | * | 2/2000 | Bareket ................................. 356/401 |
| 6,079,256 | * | 6/2000 | Bareket ................................... 73/105 |
| 6,127,075 | * | 10/2000 | Hsu ......................................... 430/30 |
| 6,128,089 | * | 10/2000 | Ausschnitt ............................ 356/401 |
| 6,137,578 | * | 10/2000 | Ausschnitt ............................ 356/399 |

\* cited by examiner

*Primary Examiner*—Richard Booth
*Assistant Examiner*—Olivia Luk
(74) *Attorney, Agent, or Firm*—Charles W. Bethards; Robert F. Hightower

(57) ABSTRACT

A multi-level registration control system for a photolithography process includes a photolithography device that prints first, second and third layers on a wafer. A first overlay mark defines overlay errors in a first direction between the first and third layer. The first overlay mark also defines overlay errors between the second and third layers. An overlay measurement device measures the overlay errors and generates an overlay signal. A feedback controller is connected to the overlay measurement device and the photolithography device. The feedback controller receives the overlay error signal and generates and transmits an alignment correction signal to the photolithography device. The first overlay mark is a box-in-box overlay mark or a frame-in-frame overlay mark. By providing a single overlay mark to align three layers, the multi-layer overlay control system reduces scribe grid area and saves useful silicone surface area.

14 Claims, 3 Drawing Sheets

MULTI-LAYER REGISTRATION CONTROL FOR PHOTOLITHOGRAPHY PROCESSES

BACKGROUND OF THE INVENTION

1. FIELD OF THE INVENTION

The present invention relates to photolithography processes, and more particularly, to methods and apparatus for multi-layer registration control in a photolithography process.

2. BACKGROUND INFORMATION

In a typical integrated circuit (IC) manufacturing process, a silicon wafer goes through many levels of processing to form the IC. Following a photoprocessing layer, designed circuit patterns are printed on multiple layers of a wafer surface to form the IC. Each layer must be aligned with a prior layer for the IC to operate properly. An overlay controller is generally employed to achieve alignment of two layers within the IC. The accuracy of the overlay controller directly impacts the yield of the IC manufacturing process. As a minimum feature size of the IC shrinks, the tolerance of the overlay controller becomes correspondingly smaller.

Conventional overlay controllers for photolithography processes typically employ a reticle-to-wafer aligner, a stepper, or a scanner. An overlay measurement tool measures overlay errors. Software associated with the overlay controller analyzes the overlay errors that are generated by the overlay measurement tool. The software provides a feedback signal using appropriate correction coefficients to the aligner to correct overlay errors for wafers that are yet to be manufactured. The software generally performs on-line statistical process control (SPC) of overlays on product wafers.

The overlay measurement tool generally uses overlay marks that include overlay portions that are formed on different photolithography processing layers. The overlay marks employed generally have a box-in-box pattern or a frame-in-frame pattern. For example, in the box-in-box pattern, an outer box is printed on one layer and an inner box is printed on another layer. When the IC includes three or more layers that require overlay error measurement, two or more pairs of overlay marks are typically required. The overlay marks are placed in a scribe grid area of the wafer that reduces the available area for integrated circuits. As the scribe grid increases, the cost of each IC increases. Clearly a need exists for improved registration control for photolithography processes.

BRIEF DESCRIPTION OF THE DRAWINGS

The present invention will hereinafter be described in conjunction with the appended drawing figure(s), wherein like numerals denote like elements, and.

DETAILED DESCRIPTION OF THE PREFERRED EXEMPLARY EMBODIMENTS

The ensuing detailed description provides preferred exemplary embodiment(s) only, and is not intended to limit the scope, applicability, or configuration of the present invention. Rather, the ensuing detailed description of the preferred exemplary embodiment(s) will provide those skilled in the art with an enabling description for implementing preferred exemplary embodiment(s) of the invention. It being understood that various changes may be made in the function and arrangement of elements without departing from the spirit and scope of the invention as set forth in the appended claims.

Figure 1:
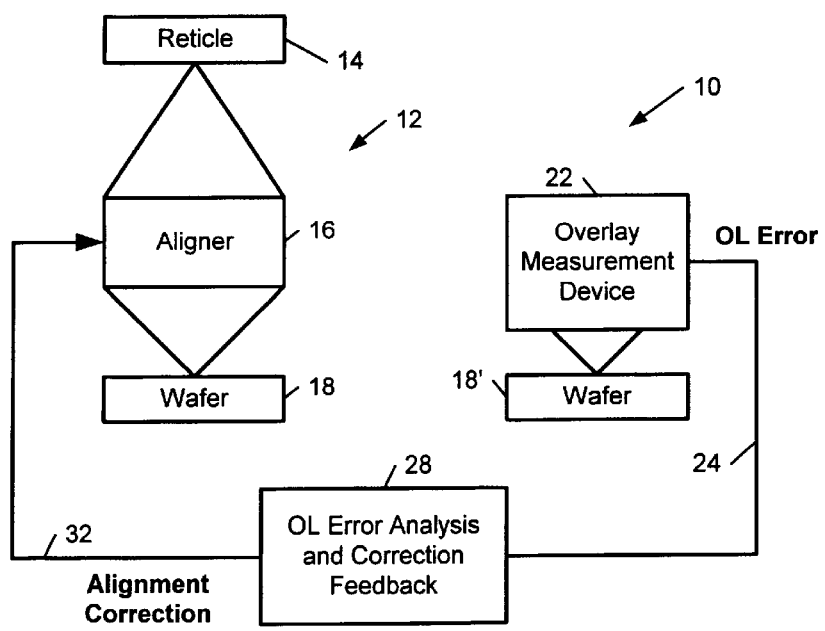
FIG. 1 illustrates a multi-layer registration control system for a photolithography process.

Referring to FIG. 1, a multi-layer registration control system 10 for a photolithography process is illustrated and includes a reticle-to-wafer aligner 12 that includes a reticle 14 and an aligner 16. During a photolithography process, one or more layers are printed on a wafer 18. As the layers are printed, one or more overlay marks are also printed in a scribe grid area. The overlay marks are used to align the layers. After exposure, an overlay measurement device 22 generates an overlay error signal 24 for multiple layers (not shown in FIG. 1) that are formed on the wafer 18'. An error analysis and correction feedback device 28 receives the overlay error signal 24 and provides an alignment correction signal 32 to the aligner 16. The error analysis and correction feedback device 28 is implemented using a controller with a microprocessor and memory (not shown). A computer that includes a display, an output device such as a keyboard and/or a mouse, and one or more I/O devices such as a printer, a scanner or other conventional I/O devices may be employed if desired.

The printed circuit patterns and the overlay marks are preferably formed using photolithography in which a circuit pattern is drawn, photographed, and reduced to a negative that is also called a photomask. To print the circuit pattern for the IC and the overlay mark, light is passed through the photomask onto the wafer 18 that is made of a semiconductor material that has been coated with a photoresistive material. When light strikes the photoresistive material, the composition of the photoresistive material is changed. If a positive photoresist was used, the photoresistive material that was not affected by light is washed off. If a negative photoresist was used, the photoresistive material that is affected by light is washed off. The semiconductor material is exposed to an etching solution that eats away the surface that is not protected by the photoresistive material to create a desired circuit pattern on the wafer 18.

Figure 2A:
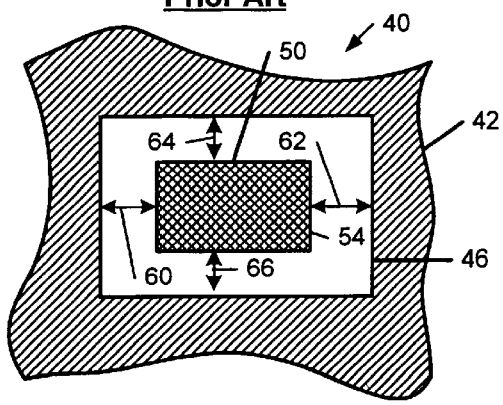
FIG. 2A illustrates a plan view of a box-in-box overlay mark according to the prior art.
Figure 2B:
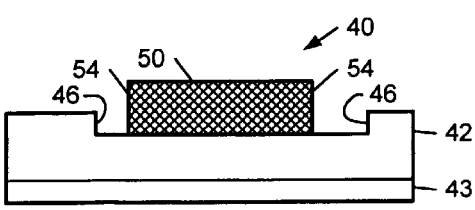
FIG. 2B illustrates a cross-sectional view of the box-in-box overlay mark of FIG. 2A.

Referring now to FIGS. 2A and 2B, an overlay mark 40, according to the prior art, is illustrated. A first layer 42 of the overlay mark 40 is deposited or grown on a substrate 43. Using a first photomask, a box registration pattern 46 is printed on the first layer 42 at the same time that a first circuit pattern is printed on the first layer 42. The first layer 42 is etched. A second layer 50 is deposited or grown on the first layer 42. Using a second photomask, a second box registration pattern 54 is printed at the same time that a second circuit pattern is printed on the second layer 50. Alignment of the first layer 42 with respect to the second layer 50 is measured using the overlay measurement device 22. If alignment is performed prior to etching, and the second layer 42 is not aligned correctly, the second layer is removed, is re-deposited or regrown and is printed with a new alignment. If alignment is performed after etching the second layer 42, the second layer cannot be removed. The overlay measurement device 22 measures at least one of the distances indicated by arrows 60 and 62 to measure alignment in a first direction. The overlay measurement device 22 likewise measures at least one of the distances indicated by arrows 64 and 66 to measure alignment in a second direction that is orthogonal to the first direction.

Figure 3A:
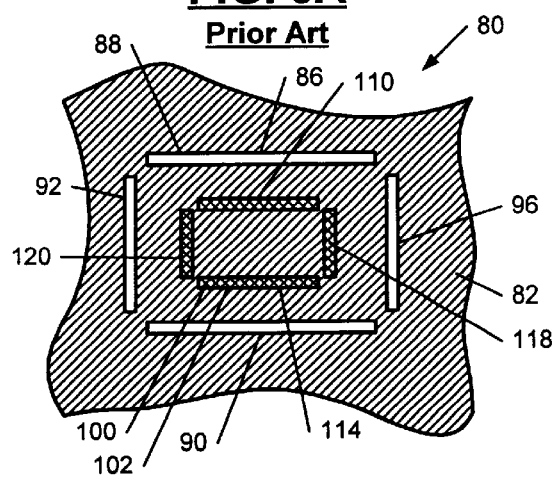
FIG. 3A illustrates a frame-in-frame overlay mark of the prior art.
Figure 3B:
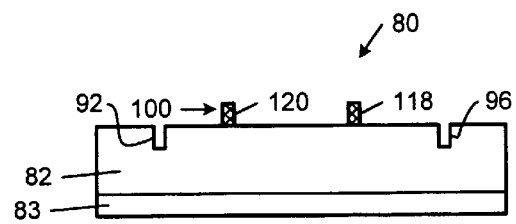
FIG. 3B illustrates a cross-sectional view of the frame-in-frame overlay mark of FIG. 3A.

Referring now to FIGS. 3A and 3B, a frame-in-frame overlay mark 80 is illustrated. A first layer 82 is deposited or grown on a substrate 83. Using a first photomask, an outer frame registration pattern 86 of the overlay mark 80 is printed at the same time that a first circuit pattern is printed on the first layer 82. The outer frame registration pattern 86 includes a first pair of parallel segments 88 and 90 and a second pair of parallel segments 92 and 96 that are printed on the first layer 82. The first layer 82 is etched. A second layer 100 is deposited on the first layer 82. Using a second photomask, an inner frame registration pattern 102 of the overlay mark 80 is printed at the same time as a second circuit pattern is printed on the second layer 100. The inner frame registration pattern 102 includes a first pair of parallel segments 110 and 114 and a second pair of parallel segments 118 and 120 that are oriented perpendicular to the segments 110 and 114. Etching of the second layer 100 can be performed before or after alignment. If etching of the second layer 100 is performed after alignment, incorrect alignment can be corrected without losing the wafer. In a similar manner as that described above with respect to FIGS. 2A and 2B, one or more distances between the inner and outer frame registration pattern 102 and 110 are measured and used to generate alignment correction signals. The box-in-box overlay mark 40 and the frame-in-frame overlay mark 80 are used to align the first and second circuit patterns.

Figure 4:
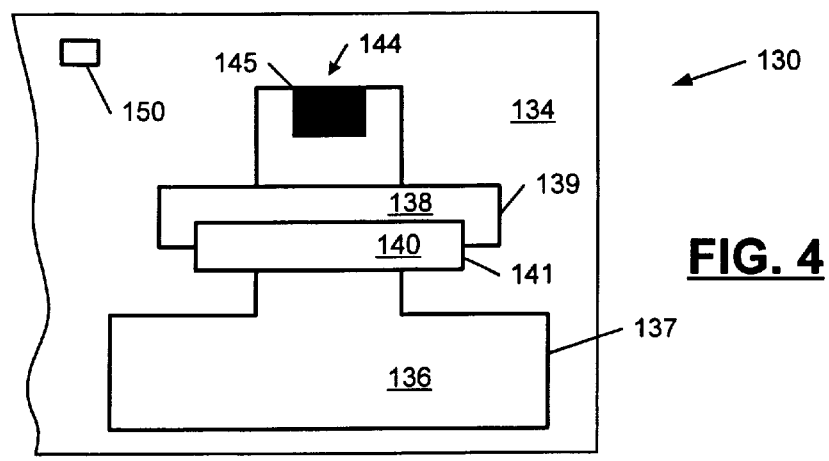
FIG. 4 illustrates an IC that requires alignment of three layers.

Referring now to FIG. 4, an IC 130 is illustrated. The IC includes a wafer 134 with a first layer 136 that is deposited or grown on a substrate. A first circuit pattern 137 is printed on the first layer 136 using a first photomask. A second layer 138 is deposited or grown on the first layer 136. A second circuit pattern 139 is printed on the second layer 138 using a second photomask. A third layer 140 is deposited or grown on the second layer 138. A third circuit pattern 141 is printed on the third layer 140 using a third photomask. A fourth layer 144 is deposited or grown on the third layer 140. A fourth circuit pattern 145 is printed on the fourth layer 144 using a fourth photomask. In a preferred embodiment, the first layer 136 is an active layer, the second layer 138 is a first polysilicon layer, the third layer 140 is a second polysilicon layer, and the fourth layer 144 is a contact layer. While a specific orientation of active, contact and polysilicon layers is disclosed herein, skilled artisans can appreciate that the present invention has application for aligning any three layers. Furthermore, while four layers are disclosed, alignment of the first, second and fourth layers is performed. Thus, the present invention contemplates alignment of three layers with or without intervening layers. As in the case of conventional overlay marks, an overlay mark 150 is created during processing of the IC 130 to align three layers thereof.

In the IC 130 according to the preferred embodiment, the fourth layer 144 (the contact layer) requires a tight tolerance to the first layer 136 (the active layer) in a first direction. In addition, the fourth layer 144 (the contact) requires a tight tolerance to the second layer 138 (the first polysilicon layer) in a second direction that is orthogonal to the first direction. If conventional overlay control systems and methods are employed, two pairs of overlay marks would be required to obtain overlay errors for these layers. Because the two pairs of overlay marks would generally be required, the scribe grid area for the two overlay marks is larger than it would be if a single overlay mark was used. The wafer area that is available for the IC is correspondingly reduced. The feedback software that is normally employed in the multi-layer overlay controller would need to be modified to generate the correct overlay error signals for the reticle-to-wafer aligner 12. In other words, the feedback software needs to be modified to select the required directional overlay errors from two pairs of overlay error data for SPC and for proper feedback error correction.

Figure 5A:
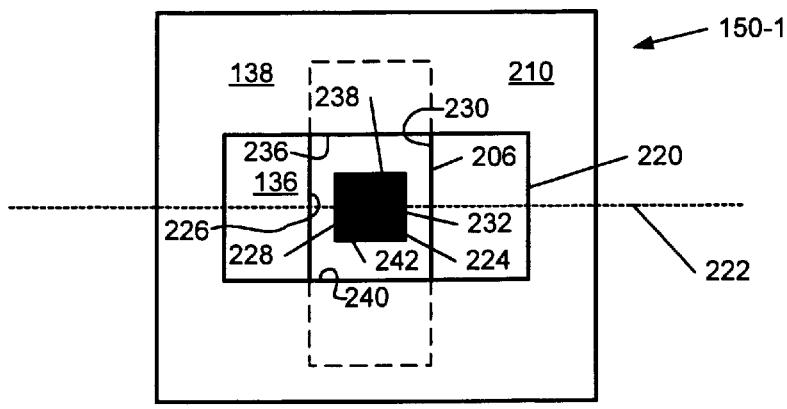
FIG. 5A illustrates a box-in-box overlay mark according to the present invention for aligning the three layers of the IC illustrated in FIG. 4.
Figure 5B:
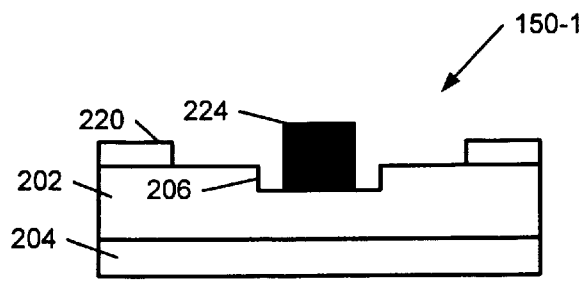
FIG. 5B is a cross-sectional view of the box-in-box overlay mark of FIG. 5A.

Referring now to FIGS. 4, 5A, and 5B, an overlay mark 150-1 that is used to align three layers of the IC 130 is shown. The overlay mark 150-1 is processed at the same time that the first, second, and fourth layers 136, 138, and 144, respectively, are processed. The steps for creating the layers will be repeated during the description of the processing of the overlay mark 150-1 for purposes of clarity. The first layer 136 is deposited or grown on a substrate 204. The first circuit pattern is printed on the first layer 136 using the first photomask. A first registration pattern 206 of the overlay mark 150-1 is also printed on the first layer 136 using the first photomask. The first layer 136 is etched. The second layer 138 is deposited and grown on the first layer 136. The second circuit pattern 139 is printed on the second layer 138 using the second photomask. A second registration pattern 220 of the overlay mask 150-1 is printed on the second layer 138 using the second photomask. The second registration pattern 220 bisects and is generally perpendicular to the first registration pattern 206. The second layer 138 is etched. The third layer 140 is deposited or grown on the second layer 138. The third layer is etched. The third circuit pattern is printed on the third layer 140 using the third photomask. The third layer 140 is etched. The fourth layer 144 is deposited or grown on the first layer 136. The fourth circuit pattern is printed on the fourth layer 144 using the fourth photomask. A third registration pattern 224 is printed on the fourth layer 144 using the fourth photomask. As discussed previously, the fourth layer 144 (or the third layer to be aligned) can be etched prior to or after alignment.

An overlay error in a first direction between the first layer 136 and the second layer 138 is measured. The overlay measurement device 22 measures a first distance between a first side 226 of the first registration pattern 206 and a first side 228 of the third registration pattern 224. The overlay measurement device 22 can also measure a second distance between a second side 230 of the first registration pattern 206 and a second side 232 of the third registration pattern 224. An overlay error in a second direction is measured by the overlay measurement device 22. The overlay measurement device 22 measures a third distance between a third side 236 of the second registration pattern 220 and a third side 238 of the third registration pattern 224. The overlay measurement device can also measure a fourth distance between a second side 240 of the second registration pattern 220 and a fourth side 242 of the third registration pattern 224.

Figure 6A:
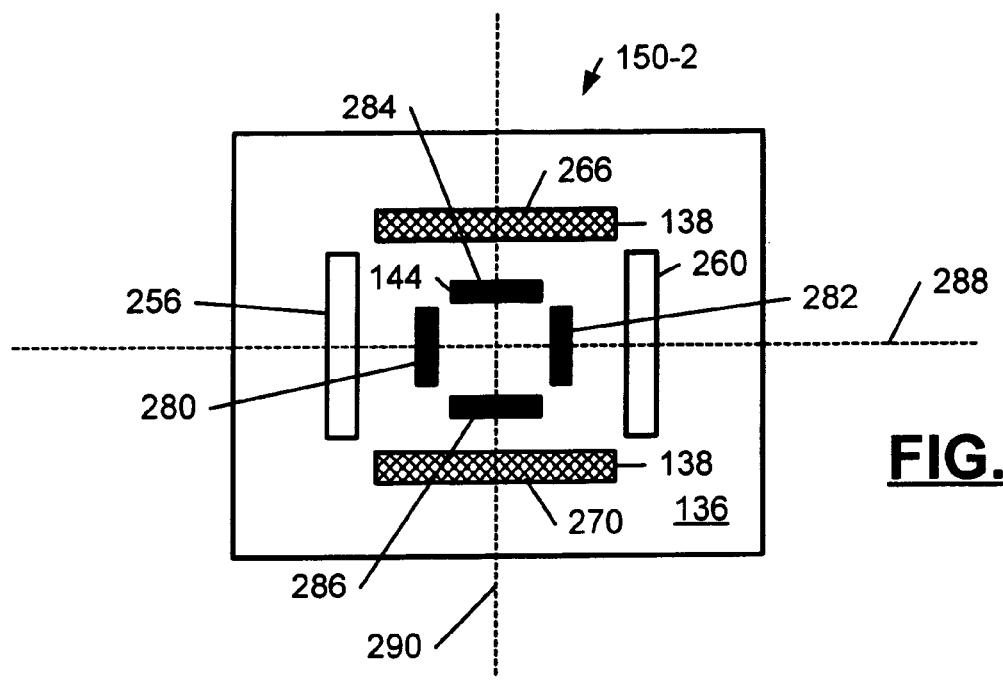
FIG. 6A is a plan view of a frame-in-frame overlay mark according to the present invention for aligning the three layers of the IC illustrated in FIG. 4.
Figure 6B:
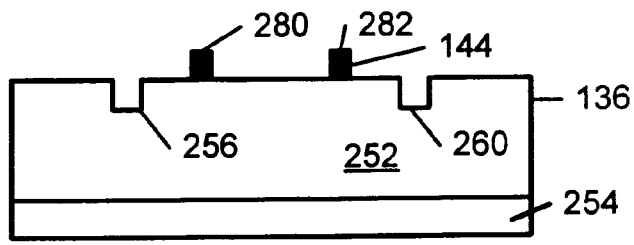
FIG. 6B is a first cross-sectional view of the frame-in-frame overlay mark of FIG. 6A.
Figure 6C:
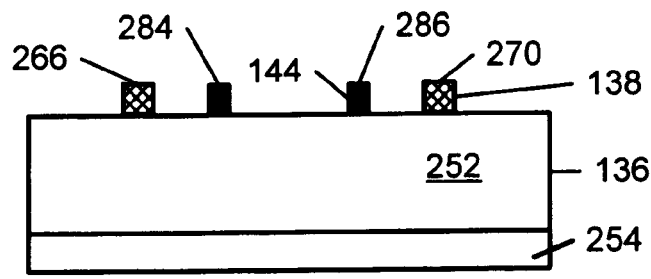
FIG. 6C is a second cross-sectional view that is orthogonal to the view shown in FIG. 6B of the frame-in-frame overlay mark of FIG. 6A.

Referring now to FIGS. 6A–6C, an alternative overlay mark 150-2 according to the present invention is illustrated and includes the first layer 136 that is deposited or grown on a substrate 254. When the first circuit pattern is printed on the first layer 136 using the first photomask, first and second registration patterns 256 and 260 of the overlay mark 150-2 are also printed on the first layer 136 using the first photomask. The first layer 136 is etched.

The second layer 138 is deposited or grown on the first layer 136. The second circuit pattern is printed on the second layer 138 using the second photomask. When the second circuit pattern is printed using the second photomask, third and fourth registration patterns 266 and 270 of the overlay mark 150-2 are also printed in the second layer 138 using the second photomask. The second layer 138 is etched. The third layer 140 is deposited or grown on the second layer 138. The third layer 140 is etched. The fourth layer 144 is deposited or grown on the third layer 140. When the fourth circuit pattern is printed in the fourth layer 144 using the fourth photomask, fifth sixth, seventh, and eighth registration patterns 280, 282, 284, and 286 are printed on the fourth layer 144 using the fourth photomask. As discussed previously, the fourth layer 144 can be etched prior to or after alignment.

The overlay measurement device 22 measures a first overlay error in a first direction between the first layer 136 and the fourth layer 144 by measuring a first distance between the first registration pattern 256 and the fifth registration pattern 280. The overlay measurement device 22 can also measure a second distance between the second registration pattern 260 and the sixth registration pattern 282.

The overlay measurement device 22 measures a second overlay error in a second direction that is perpendicular to the first direction between the second layer 138 and the fourth layer 144 by measuring a third distance between the first registration pattern 266 and the seventh registration pattern 284. The overlay measurement device 22 can also measure a fourth distance between the second registration pattern 270 and the eighth registration pattern 286. The first and second overlay errors are output to the error analysis and correction feedback device 28 that generates the alignment correction signal 32 for the aligner 16.

As can be appreciated, the multi-layer overlay controller according to the invention is fully compatible with existing multi-layer registration control systems for photolithography processes. The multi-layer overlay controller according to the invention performs overlay measurements using a single overlay mark to align three layers. Eliminating the extra overlay measurements reduces the process cycle time for the integrated circuit. In addition, the scribe grid area is reduced which saves useful silicon surface area by eliminating extra overlay measurement marks.

While the principles of the invention have been described above in connection with specific apparatus, it is to be clearly understood that this description is made only by way of example and not as a limitation on the scope of the invention.

What is claimed is:

1. A method for measuring overlay error in a photolithography process, the method comprising:

growing a first layer;

printing a first circuit pattern on said first layer using a first photomask;

printing a first registration pattern on said first layer using said first photomask;

etching said first layer;

growing a second layer on said first layer;

printing a second circuit pattern on said second layer using a second photomask;

printing a second registration pattern on said second layer using said second photomask;

etching said second layer;

growing a third layer on at least one of said first and second layers;

printing a third circuit pattern on said third layer using a third photomask; and printing a third registration pattern on said third layer using said third photomask, wherein said first, second and third registration patterns form an overlay mark that defines overlay errors in a first direction between said first and third layers and in a second direction between said second and third layers.

2. The method as claimed in claim 1 wherein said overlay mark is a box-in-box overlay mark.

3. The method as claimed in claim 1 wherein said third layer is grown on said first layer in a bisection area defined by said first and second registration patterns.

4. The method as claimed in claim 1, the method further comprises:

measuring an overlay error in said first direction between said first layer and said third layer by measuring a first distance between a first side of said first registration pattern and a first side of said third layer.

5. The method as claimed in claim 4, the method further comprises:

measuring said overlay error in said first direction between said first layer and said third layer by measuring a second distance between a second side of said first registration pattern and a second side of said third layer.

6. The method as claimed in claim 1, the method further comprises:

measuring an overlay error in said second direction between said second layer and said third layer by measuring a third distance between a first side of said second registration pattern and a third side of said third layer.

7. The method as claimed in claim 6, the method further comprises:

measuring said overlay error in said second direction between said first layer and said third layer by measuring a fourth distance between a second side of said second registration pattern and a fourth side of said third layer.

8. The method as claimed in claim 1 further comprising:

an intervening layer that is located between at least one of said first and second layers and said second and third layers.

9. A method for measuring overlay error in a photolithography process, the method comprising:

growing a first layer;

printing a first circuit pattern on said first layer using a first photomask;

printing first and second registration patterns on said first layer using said first photomask;

etching said first layer;

growing a second layer on said first layer;

printing a second circuit pattern on said second layer using a second photomask;

printing third and fourth registration patterns on said second layer using said second photomask;

etching said second layer;

growing a third layer on at least one of said first and second layers; and printing a third circuit pattern on said third layer using a third photomask;

printing fifth, sixth, seventh and eighth registration patterns on said third layer using said third photomask, wherein said first, second, third, fourth, fifth, sixth, seventh and eighth registration patterns form an overlay mark that defines overlay errors in a first direction between said first and third layers and in a second direction between said second and third layers.

10. The method as claimed in claim 9 wherein said overlay mark is a frame-in-frame overlay mark.

11. The method as claimed in claim 9, the method further comprises:

measuring a first overlay error in said first direction between said first layer and said third layer by measuring a first distance between said first and said fifth registration patterns.

12. The method as claimed in claim 11, the method further comprises:

measuring a first overlay error in said first direction between said first layer and said third layer by measuring a second distance between said second and sixth registration patterns.

13. The method as claimed in claim 9, the method further comprises:

measuring a second overlay error in said second direction between said second layer and said third layer by measuring a third distance between said third and said seventh registration patterns.

14. The method as claimed in claim 13, the method further comprises:

measuring a second overlay error in said second direction between said second layer and said third layer by measuring a fourth distance between said fourth and said eighth registration patterns.

* * * * *